(12) United States Patent
Uebayashi et al.

(10) Patent No.: US 10,901,031 B2
(45) Date of Patent: Jan. 26, 2021

(54) ELECTRIC CONNECTING APPARATUS

(71) Applicant: Kabushiki Kaisha Nihon Micronics, Tokyo (JP)

(72) Inventors: Masatomo Uebayashi, Oita (JP); Akihisa Akahira, Oita (JP); Tomoaki Kuga, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/320,818

(22) PCT Filed: Jul. 18, 2017

(86) PCT No.: PCT/JP2017/025891
§ 371 (c)(1),
(2) Date: Jan. 25, 2019

(87) PCT Pub. No.: WO2018/021088
PCT Pub. Date: Feb. 1, 2018

(65) Prior Publication Data
US 2019/0170817 A1 Jun. 6, 2019

(30) Foreign Application Priority Data

Jul. 27, 2016 (JP) .................. 2016-147102

(51) Int. Cl.
*G01R 31/28* (2006.01)
*G01R 1/073* (2006.01)
*G01R 31/26* (2020.01)

(52) U.S. Cl.
CPC ......... *G01R 31/2889* (2013.01); *G01R 1/073* (2013.01); *G01R 31/26* (2013.01);
(Continued)

(58) Field of Classification Search
CPC .... G01R 31/2889; G01R 31/28; G01R 31/26; G01R 31/2818; G01R 31/2884;
(Continued)

(56) References Cited

U.S. PATENT DOCUMENTS 4,783,624 A   11/1988 Sabin
4,963,822 A   10/1990 Prokopp
(Continued)

FOREIGN PATENT DOCUMENTS

JP   S6435382 A   2/1989
JP   H0729838 A   1/1995
(Continued)

*Primary Examiner* — Christopher P McAndrew
(74) *Attorney, Agent, or Firm* — Lorenz & Kopf, LLP

(57) ABSTRACT

Provided is an electric connecting apparatus 10 including a plurality of probes 20, a probe substrate 16 connected to base end portions 20*b* of the probes 20, and a probe support body 18, when tip end portions 20*a* of the probes 20 are pressed by a device under test, preventing the adjacent probes 20 from interfering. The probe support body 18 includes a plate-like guide portion 30 including guide holes through which the probes 20 pass. The guide portion 30 includes an upper guide portion 31, a lower guide portion 32, and a middle guide portion 33. The probes pass through the guide holes of the upper guide portion 31, the middle guide portion 33, and the lower guide portion 32 to be guided toward the device under test. The middle guide portion 33 is provided to be movable in a perpendicular direction X perpendicular to a thickness direction Y.

19 Claims, 9 Drawing Sheets

(52) U.S. Cl.
CPC ......... *G01R 31/28* (2013.01); *G01R 31/2818* (2013.01); *G01R 31/2884* (2013.01)

(58) Field of Classification Search
CPC ................ G01R 1/073; G01R 1/07371; G01R 1/07357; G01R 1/06711; G01R 1/07314; G01R 1/07364; G01R 31/2886
USPC .................................................... 324/756.03
See application file for complete search history.

(56) References Cited

U.S. PATENT DOCUMENTS

| | | | |
|---|---|---|---|
| 5,136,238 A * | 8/1992 | Kade | G01R 1/07307 324/750.2 |
| 5,625,297 A | 4/1997 | Arnaudov et al. | |
| 6,150,830 A | 11/2000 | Schmid et al. | |
| 6,255,832 B1 | 7/2001 | Notohardjono et al. | |
| 2001/0028255 A1 | 10/2001 | Endo | |
| 2002/0155735 A1* | 10/2002 | Zhou | G01R 1/06733 439/66 |
| 2003/0141861 A1* | 7/2003 | Navratil | G01R 31/2886 324/756.07 |
| 2004/0005792 A1 | 1/2004 | Sabatier et al. | |
| 2004/0124862 A1 | 7/2004 | Sugawara | |
| 2007/0046304 A1* | 3/2007 | Mok | G01R 3/00 324/750.05 |
| 2007/0126442 A1* | 6/2007 | Watanabe | G01R 1/06761 324/755.07 |
| 2008/0007280 A1* | 1/2008 | Amemiya | G01R 1/07314 324/756.03 |
| 2010/0219852 A1* | 9/2010 | Yamada | G01R 1/07371 324/756.03 |
| 2011/0028019 A1 | 2/2011 | Hwang | |
| 2011/0234251 A1* | 9/2011 | Komatsu | G01R 31/2891 324/756.03 |
| 2012/0119770 A1* | 5/2012 | Baekbo | G01R 1/06733 324/750.22 |
| 2015/0061719 A1* | 3/2015 | Lee | G01R 1/07357 324/756.03 |
| 2015/0130498 A1* | 5/2015 | Wang | G01R 31/2891 324/756.03 |
| 2015/0219710 A1* | 8/2015 | Lee | G01R 1/0735 324/756.03 |
| 2015/0276800 A1 | 10/2015 | Chen et al. | |
| 2016/0377655 A1* | 12/2016 | Liberini | G01R 1/07378 324/756.03 |

FOREIGN PATENT DOCUMENTS

| | | |
|---|---|---|
| JP | H1096747 A | 4/1998 |
| JP | 2001281266 A | 10/2001 |
| JP | 2003178849 A | 6/2003 |
| JP | 2004510986 A | 4/2004 |
| JP | 2010281583 A | 12/2010 |
| JP | 2012107965 A | 6/2012 |
| JP | 2015184283 A | 10/2015 |
| KR | 20060069947 A | 6/2006 |
| WO | WO2016108520 A1 | 7/2016 |

* cited by examiner

ELECTRIC CONNECTING APPARATUS

TECHNICAL FIELD

The present invention relates to an electric connecting apparatus such as a vertical operating probe card for use in an electric test of a device under test represented by an integrated circuit or the like.

BACKGROUND

In general, multiple integrated circuits formed on a semiconductor wafer undergo an electric test before being cut and separated from the wafer to determine whether or not they have performance corresponding to the specification. As an electric connecting apparatus for use in the test of this kind, a vertical operating probe card to which a plurality of probes are applied exists (for example, refer to Patent Literature 1).

In the vertical operating probe card, each linear probe extending from a probe substrate passes through a probe support body held on the probe substrate and is guided toward a device under test provided on a lower side.

The probe support body is configured to control the posture of each probe to prevent electric short circuit caused by contact between the adjacent probes from occurring and is configured to guide a tip end of each probe to a corresponding electrode pad of the device under test.

Also, as illustrated in FIG. 10(a), an example of a probe support body 1 of this kind includes a plate-like upper guide portion 3 arranged to be close to a probe substrate 2 and to be parallel to the probe substrate on a lower side of the probe substrate, a lower guide portion 5 arranged to be parallel to the upper guide portion 3, and a plate-like middle guide portion 4 arranged between the upper guide portion 3 and the lower guide portion 5.

The respective guide portions 3, 4, and 5 are provided with guide holes 3a, 4a, and 5a penetrating therethrough for probes 6 made of a linear metal material as illustrated in FIG. 10(a). The respective probes 6 are arranged to pass through the respective guide holes 3a, 4a, and 5a. The guide hole 3a of the upper guide portion 3 guides the upper end portion of each probe 6 to a corresponding connecting pad (not illustrated) of the probe substrate 2.

The respective guide holes 4a and 5a of the middle guide portion 4 and the lower guide portion 5 are aligned with each other and are arranged to be displaced in one direction from the corresponding guide hole 3a of the upper guide portion 3. Hence, each probe 6 is provided with a bent portion 6a caused by elastic deformation between the upper guide portion 3 and the middle guide portion 4 as illustrated in FIG. 10(a). Also, a tip end portion of each probe 6 projecting from the lower guide portion 5 of the probe 6 is guided vertically to face a corresponding electrode pad 7a of a device under test 7 due to cooperation between both the guide holes 4a and 5a of the middle guide portion 4 and the lower guide portion 5.

When the device under test 7 is moved toward the probe substrate 2 for an electric test of the device under test 7, for example, each probe 6 receives an upward pressing force illustrated by an arrow 8 in FIG. 10(b) from the corresponding electrode pad 7a due to this movement. When the tip end of each probe 6 is pressed upward toward the probe substrate 2 by this upward pressing force, the tip end portion of each probe 6 moves upward along with the pressing.

Also, a base end of each probe 6 is secured to the probe substrate 2 to restrict movement thereof. For this reason, when the tip end portion of each probe 6 is pressed upward toward the probe substrate 2, the bent portion 6a formed in each probe 6 between the middle guide portion 4 and the upper guide portion 3 illustrated in FIG. 10(a) is significantly bent due to flexural deformation illustrated in FIG. 10(b). The bending postures each including the size and the direction are controlled by the probe support body 1 so as to be equal to each other.

Accordingly, the respective probes 6 are pressed to the corresponding electrode pads 7a with appropriate spring forces caused by elastic deformation of the probes themselves without shorting each other. Also, when the device under test 7 moves away, pressing of the tip end portion of each probe 6 is released, and each probe 6 thus elastically returns to the shape in FIG. 10(a). Consequently, an electric test of the device under test 7 can be repeated with use of the vertical operating probe card.

CITATION LIST

Patent Literature

Patent Literature 1: JP 7-29838 A

SUMMARY OF INVENTION

Technical Problem

However, in the vertical operating probe card according to the conventional art, when the pressing of the tip end portion of each probe 6 is released to cause each probe 6 to elastically return as illustrated in FIG. 10(b), the bent portion 6a of each probe 6 is strongly pressed to an edge portion of the guide hole 4a of the middle guide portion 4 due to the flexural deformation of each probe 6 as illustrated by the dashed line in FIG. 10(b). In this manner, when the probe 6 is strongly pressed to the edge portion of the guide hole 4a of the middle guide portion 4, the probe 6 stops in a pressed state in some cases.

In this case, as illustrated in FIG. 10(c), even when the device under test 7 moves away to cause the pressing of the tip end portion of each probe 6 to be released, the shape of the probe 6 is in an unreturned state without returning as in the state in FIG. 10(a), which causes a problem in which the electric test cannot be repeated.

Also, even in a case in which a probe does not have a bent portion (for example, a vertical probe), when the probe is strongly pressed to the edge portion of the guide hole 4a, the probe and the edge portion of the guide hole may be in friction with each other, and the probe may be damaged. For this reason, regardless of whether or not there is a bent portion, a measure to prevent the probe from being strongly pressed to the edge portion is highly required.

The present invention is accomplished by taking such problems as mentioned above into consideration thereof, and an object thereof is to provide an electric connecting apparatus enabling a probe to be prevented from being strongly pressed to an edge portion of a guide hole.

Solution to Problem

To achieve the above object, a first aspect of an electric connecting apparatus according to the present invention is an electric connecting apparatus including a plurality of probes pressed at tip end portions thereof by a device under test, a probe substrate connected to base end portions of the plurality of probes, and a probe support body, when the tip end portions of the plurality of probes are pressed by the device under test, preventing the adjacent probes of the plurality of probes from interfering with each other. The probe support body includes a plate-like guide portion arranged on a lower side of the probe substrate and including a plurality of guide holes through which the plurality of probes pass. The guide portion includes an upper guide portion, a lower guide portion, and a middle guide portion arranged between the upper guide portion and the lower guide portion. The upper guide portion includes a plurality of upper guide holes, the middle guide portion includes a plurality of middle guide holes, and the lower guide portion includes a plurality of lower guide holes. The plurality of probes pass through the upper guide holes, the middle guide holes, and the lower guide holes to be guided toward the device under test. The middle guide portion is provided to be movable in a perpendicular direction perpendicular to a thickness direction of the middle guide portion.

As a second aspect of the electric connecting apparatus according to the present invention, each of the plurality of probes includes between the upper guide portion and the lower guide portion a bent portion bent when each of the plurality of probes is pressed by the device under test.

As a third aspect of the electric connecting apparatus according to the present invention, the middle guide portion is provided to be movable in the thickness direction of the middle guide portion.

As a fourth aspect of the electric connecting apparatus according to the present invention, the guide portion further includes an auxiliary secured guide portion provided to be secured between the middle guide portion and the lower guide portion, the auxiliary secured guide portion includes an auxiliary secured guide hole, and each of the plurality of probes passes through the upper guide hole, the middle guide hole, the auxiliary secured guide hole, and the lower guide hole.

As a fifth aspect of the electric connecting apparatus according to the present invention, a movable chamber defining a movable range of the middle guide portion is provided between the upper guide portion and the lower guide portion.

As a sixth aspect of the electric connecting apparatus according to the present invention, the movable chamber includes a positional adjusting portion adjusting a position of the middle guide hole to a position of the lower guide hole in the perpendicular direction perpendicular to the thickness direction.

As a seventh aspect of the electric connecting apparatus according to the present invention, a positional adjusting portion adjusting a position of the middle guide hole to a position of the lower guide hole in the perpendicular direction perpendicular to the thickness direction is provided between the upper guide portion and the lower guide portion.

As an eighth aspect of the electric connecting apparatus according to the present invention, the positional adjusting portion is an elastic body moving the middle guide portion at least either in the thickness direction or in the perpendicular direction of the middle guide portion.

As a ninth aspect of the electric connecting apparatus according to the present invention, the movable chamber includes a mounting surface mounting the middle guide portion, and the mounting surface is inclined toward the lower guide hole so that the middle guide portion may slide on the mounting surface to cause a position of the middle guide hole in the perpendicular direction perpendicular to the thickness direction to be adjusted to a position of the lower guide hole.

As a tenth aspect of the electric connecting apparatus according to the present invention, the guide portion includes between the middle guide portion and the upper guide portion a second middle guide portion provided to be movable in the perpendicular direction perpendicular to the thickness direction, and the second middle guide portion is arranged further on an upper side in the thickness direction than the bent portion.

Advantageous Effects of Invention

With the electric connecting apparatus according to the present invention, it is possible to prevent a probe from being strongly pressed to an edge portion of a guide hole.

DESCRIPTION OF EMBODIMENTS

Hereinbelow, an electric connecting apparatus according to embodiments of the present invention will be described in detail with reference to the drawings. Each of the embodiments described below illustrates an apparatus or the like to embody a technical idea of the present invention, and the technical idea of the present invention shall not specify arrangement or the like of respective components into one described below. The technical idea of the present invention can be altered in various ways within the scope of the patent claims.

Embodiment 1

Figure 1:
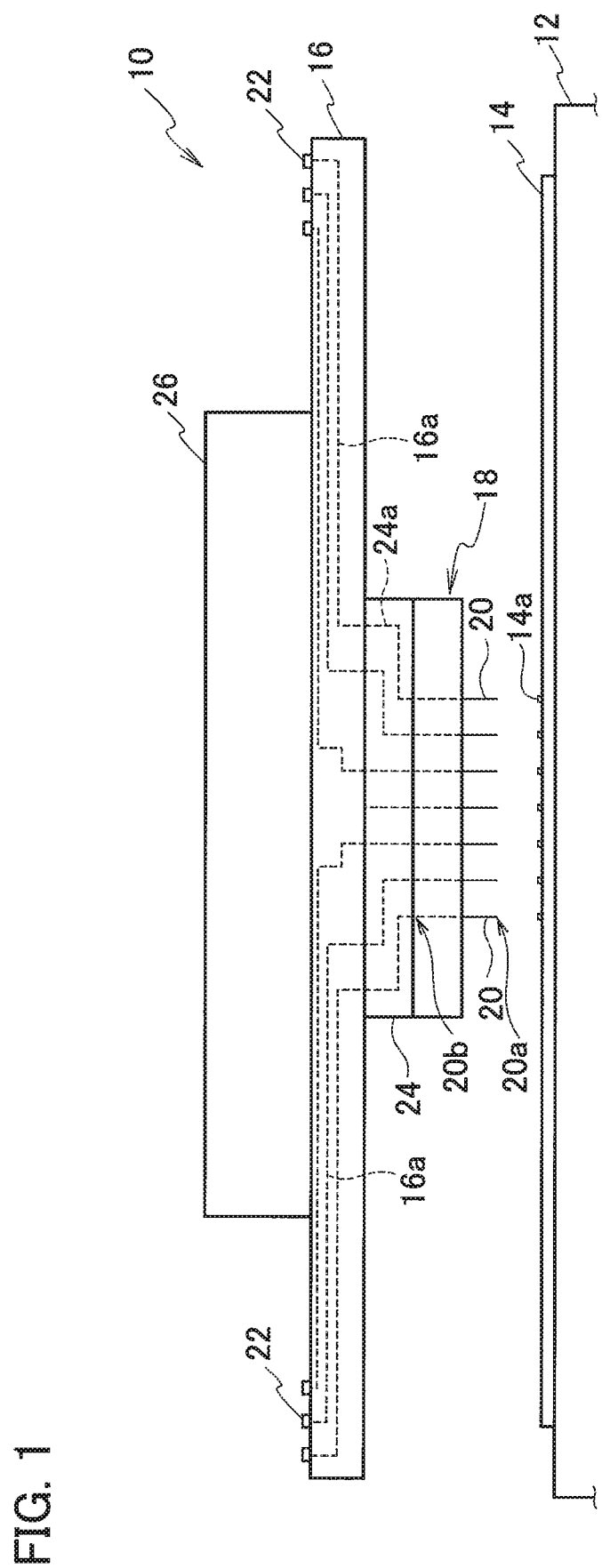
FIG. 1 is a schematic side view illustrating an electric connecting apparatus according to Embodiment 1 of the present invention.

FIG. 1 is a side view illustrating a schematic configuration of an electric connecting apparatus 10 according to Embodiment 1 of the present invention.

As illustrated in FIG. 1, the electric connecting apparatus 10 according to Embodiment 1 of the present invention is referred to as a vertical operating probe card and is held to a frame (not illustrated) on an upper side of a chuck 12 enabling upward and downward movement. As illustrated in the example in FIG. 1, a semiconductor wafer 14 serving as a device under test is held on the chuck 12. The semiconductor wafer 14 incorporates multiple integrated circuits.

The semiconductor wafer 14 is arranged on the chuck 12 with multiple electrode pads 14a of the integrated circuits facing upward for an electric test of the integrated circuits.

The electric connecting apparatus 10 includes a probe substrate 16, a probe support body 18, and a plurality of probes 20.

The probe substrate 16 is a circular rigid wiring board, for example. The probe substrate 16 is connected to base end portions 20b (upper end portions) of the probes 20.

In the example in FIG. 1, the probe substrate 16 holds on one surface thereof a space transformer 24 serving as a connector and is electrically connected to the base end portions 20b of the probes 20 via corresponding wires 24a of the space transformer 24.

A circumferential portion of a first surface (upper surface illustrated in FIG. 1) of the probe substrate 16 is provided with multiple tester lands 22 serving as connecting ends to a not-illustrated tester, and the respective tester lands 22 are connected to the space transformer 24 provided on a second surface (lower surface illustrated in FIG. 1) of the probe substrate 16 via wires 16a provided in the probe substrate 16.

Also, the first surface of the probe substrate 16 is provided with a reinforcing plate 26 made of, e.g., metal, reinforcing the probe substrate 16, and the reinforcing plate 26 is arranged at a center portion of the probe substrate 16 except at the circumferential portion provided with the tester lands 22.

The probe support body 18, as well as the space transformer 24, is held to the probe substrate 16. The probe support body 18 prevents the adjacent probes 20 from interfering with each other when tip end portions 20a (lower end portions) of the probes 20 are pressed by the semiconductor wafer 14. A detailed configuration of the probe support body 18 will be described below (refer to FIG. 2).

The tip end portions 20a of the probes 20 are pressed by the semiconductor wafer 14. As a result, since the probes 20 are electrically connected to the semiconductor wafer 14, the semiconductor wafer 14 is electrically connected to the tester lands 22 via the probes 20, the wires 24a, and the wires 16a.

Each of the probes 20 is made of a linear metal member. The metal member may be tungsten, for example. For example, the probe 20 is elastic. The probe 20 is held in a predetermined shape in a free state in which no external force acts on the probe 20, is deformed in a predetermined shape in a state in which an external force providing flexural deformation (hereinbelow, a flexural external force) is provided, and returns to the original predetermined shape in a state in which the flexural external force is eliminated.

Configuration of Probe Support Body

Figure 2:
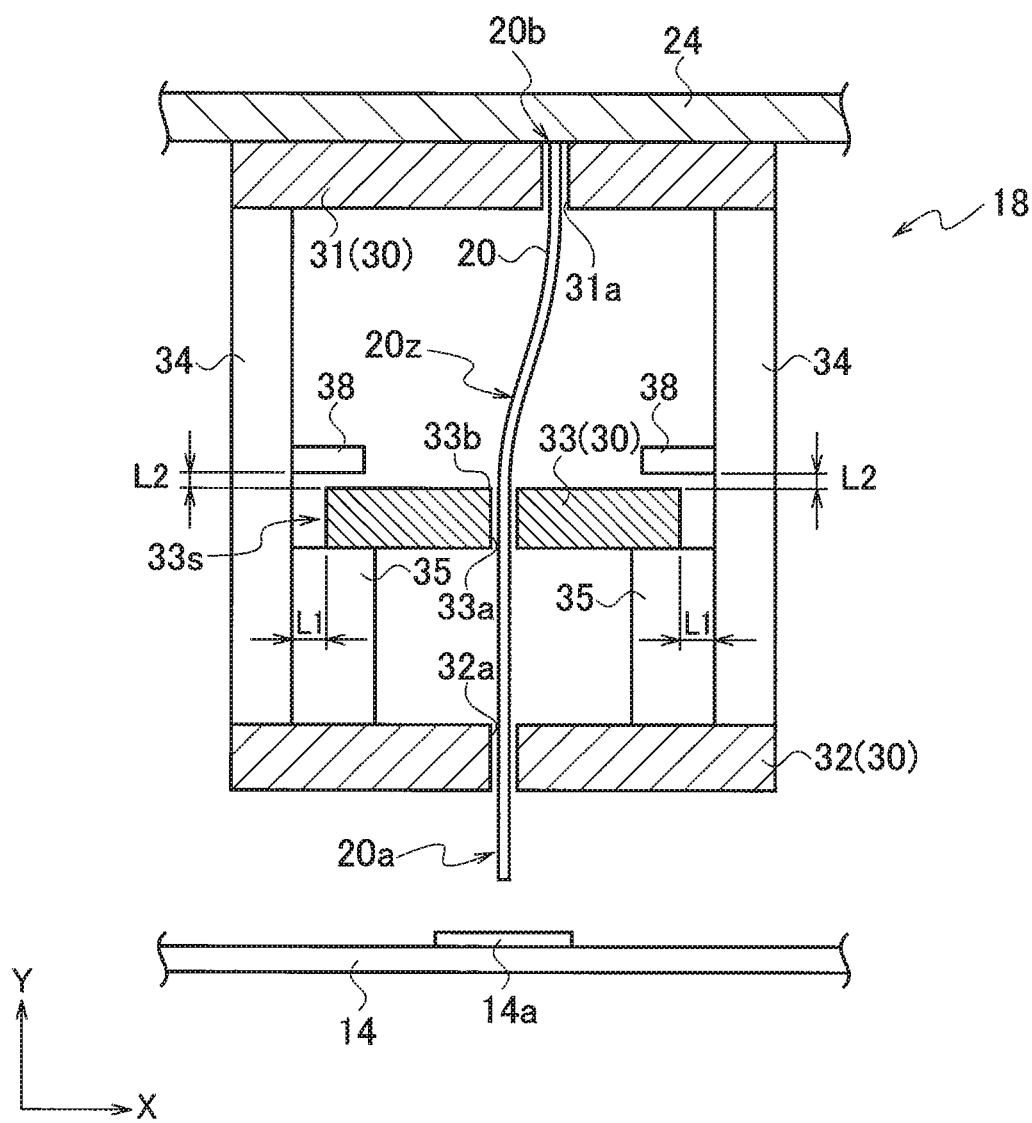
FIG. 2 is a partially enlarged cross-sectional view schematically illustrating a part of the electric connecting apparatus according to Embodiment 1 of the present invention.

Next, a configuration of the probe support body 18 will be described. FIG. 2 is a partially enlarged cross-sectional view in which the electric connecting apparatus 10 according to Embodiment 1 of the present invention is partially enlarged. It is to be noted that, for description, in FIG. 2, an up-down direction is defined as a thickness direction Y while a right-left direction is defined as a perpendicular direction X perpendicular to the thickness direction Y.

The probe support body 18 includes a plate-like guide portion 30 arranged on a lower side of the probe substrate 16 and including a plurality of guide holes through which the plurality of probes 20 pass. The guide portion 30 has a guide effect of guiding the probes 20 by letting the probes 20 passing through the guide holes abut on the guide holes.

Specifically, the guide portion 30 includes an upper guide portion 31, a lower guide portion 32, and a middle guide portion 33 arranged between the upper guide portion 31 and the lower guide portion 32.

The upper guide portion 31, the middle guide portion 33, and the lower guide portion 32 are respectively held to be parallel to each other by a member such as a spacer member 34. The upper guide portion 31, the middle guide portion 33, and the lower guide portion 32 are respectively made of a ceramic plate or a polyimide synthetic resin plate, for example.

The upper guide portion 31 is arranged to be close to the space transformer 24. The upper guide portion 31 is provided with a plurality of upper guide holes 31a penetrating therethrough in the thickness direction Y. The upper guide holes 31a guide the base end portions 20b of the respective probes 20 to connecting positions to the corresponding wires 24a of the space transformer 24.

The middle guide portion 33 and the lower guide portion 32 are provided with a plurality of middle guide holes 33a and a plurality of lower guide holes 32a penetrating therethrough in the thickness direction Y to correspond to the upper guide holes 31a of the upper guide portion 31. Each of the middle guide holes 33a and each of the lower guide holes 32a let each of the probes 20 pass therethrough to allow the probe 20 to move in an axial direction.

The base end portion 20b of the probe 20 is guided to the connecting position to the corresponding wire 24a by the upper guide portion 31, the middle guide portion 33, and the lower guide portion 32 and is attached to a corresponding connecting pad (not illustrated) of the wire 24a with use of solder, for example. Also, each of the plurality of probes 20 passes through the upper guide hole 31a of the upper guide portion 31, the middle guide hole 33a of the middle guide portion 33, and the lower guide hole 42a of the lower guide portion 32 to be guided toward the semiconductor wafer 14. Specifically, the tip end portion of the probe 20 is guided toward the corresponding electrode pad 14a of the semiconductor wafer 14. In this manner, each probe 20 is arranged at a position corresponding to each electrode pad 14a of the semiconductor wafer 14 that the probe 20 is to be connected to.

Also, as illustrated in FIG. 2, the upper guide hole 31a is displaced from the middle guide hole 33a and the lower guide hole 32a in the perpendicular direction X as much as a predetermined amount. The probe 20 thus includes between the upper guide portion 31 and the lower guide portion 32 a bent portion 20z bent when the probe 20 is pressed by the semiconductor wafer 14. Specifically, as illustrated in FIG. 2, the probe 20 includes the bent portion 20z between the upper guide portion 31 and the middle guide portion 33.

Each bent portion 20z of each of the plurality of probes 20 is formed to be elastically deformed in an equal position and an equal posture. Accordingly, the probe 20 is arranged by the probe support body 18 in a gentle crank-like state, and the tip end portion 20a of the probe 20 projects downward from the probe support body 18 in the thickness direction Y as much as a predetermined length.

After the electrode pad 14a of the semiconductor wafer 14 abuts on the tip end portion 20a of the probe 20 projecting from the probe support body 18 for the probe 20 due to upward movement of the chuck 12, the electrode pad 14a presses the tip end portion 20a of the probe 20 upward in the thickness direction Y along with the continued upward movement of the chuck 12. This upward pressing causes the tip end portion 20a of the probe 20 to be displaced upward, and at this time, linear movement of the tip end portion 20a of the probe 20 in the thickness direction Y is assured due to the respective guide effects of the upper guide hole 31a of the upper guide portion 32, the middle guide hole 33a of the middle guide portion 33, and the lower guide hole 32a of the lower guide portion 32.

Also, since the base end portion 20b of the probe 20 is prevented from moving by the space transformer 24, the bent portion 20z of the probe 20 is elastically deformed significantly in one direction in the perpendicular direction X due to the upward pressing of the tip end portion 20a of the probe 20 by means of the electrode pad 14a.

The bent portions 20z of the plurality of probes 20 are elastically deformed in one direction to prevent electric short circuit among the probes 20 from occurring. Also, since the tip end portion 20a of each of the probes 20 is pressed by the corresponding electrode pad 14a due to appropriate flexibility of the probe 20 caused by elasticity of the probe 20, the tip end portion 20a of the probe 20 is reliably connected to the electrode pad 14a. Consequently, each of the electrode pads 14a is electrically connected to the tester (not illustrated) via the corresponding tester land 22 of the probe substrate 16, and an electric test of the semiconductor wafer 14 is performed.

Configuration of Middle Guide Portion

Next, a configuration of the middle guide portion 33 will be described. The middle guide portion 33 is provided to be movable in the perpendicular direction X (that is, along a parallel plane parallel to the upper guide portion 31 and the lower guide portion 32) perpendicular to the thickness direction Y of the middle guide portion 33. The middle guide portion 33 is also provided to be movable in the thickness direction Y of the middle guide portion 33.

Specifically, as illustrated in FIG. 2, the middle guide portion 33 is mounted on an upper surface of a lower support member 35 projecting inward from the spacer member 34. For this reason, the middle guide portion 33 is provided to be movable on the upper surface of the lower support member 35 in accordance with movement of the probe 20 passing through the middle guide hole 33a of the middle guide portion 33.

Also, the probe support body 18 includes between the upper guide portion 31 and the lower guide portion 32 a movable chamber 33s defining a movable range of the middle guide portion 33, and the middle guide portion 33 is configured to be movable inside the movable chamber 33s. The movable chamber 33s is formed by the spacer member 34, the lower support member 35 projecting inward from the spacer member 34 on a lower side of the middle guide portion 33, and an upper support member 38 projecting inward from the spacer member 34 on an upper side of the middle guide portion 33.

The spacer member 34 is arranged to be away from the middle guide portion 33 by a distance L1 in the perpendicular direction X and restricts movement of the middle guide portion 33 in the perpendicular direction X. Also, the upper support member 38 is arranged to be away from the middle guide portion 33 by a distance L2 in the thickness direction Y and restricts movement of the middle guide portion 33 in the thickness direction Y.

In this manner, the movable chamber 33s, defined with a movable range of the middle guide portion 33 in the perpendicular direction X set to be the distance L1, and with a movable range of the middle guide portion 33 in the thickness direction Y set to be the distance L2, is formed.

Effect of Embodiment 1 of Present Invention

Next, an effect of the electric connecting apparatus 10 according to Embodiment 1 of the present invention will be described.

Figure 3:
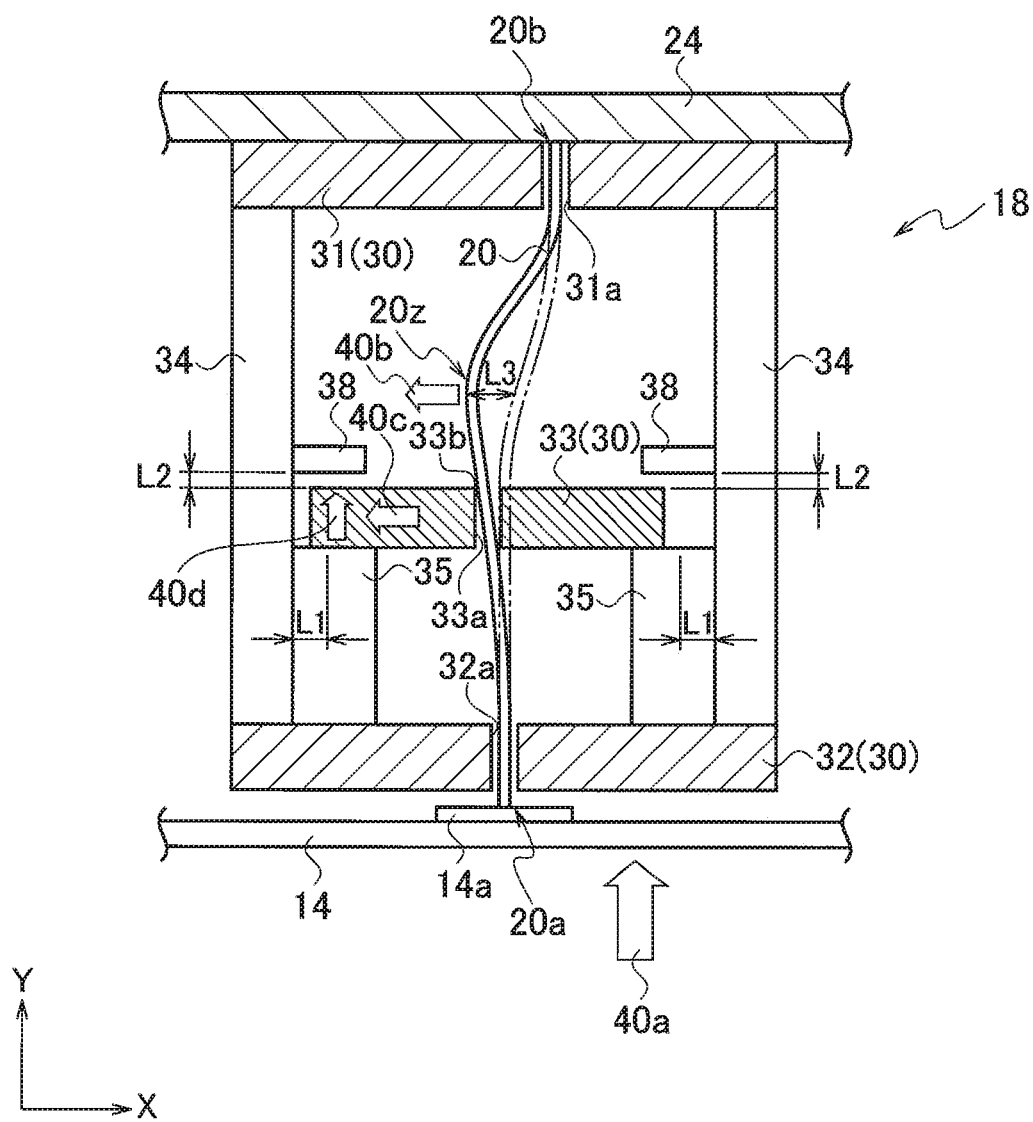
FIG. 3 is a partially enlarged cross-sectional view schematically illustrating a part of the electric connecting apparatus according to Embodiment 1 of the present invention.

FIG. 3 is a partially enlarged cross-sectional view illustrating a state in which the probe 20 is pressed by the semiconductor wafer 14 in the electric connecting apparatus 10 according to Embodiment 1 of the present invention.

As illustrated in FIG. 3, due to upward movement of the chuck 12, the electrode pad 14a of the semiconductor wafer 14 presses the tip end portion 20a of the probe 20 upward in the arrow direction labeled with a reference sign 40a. Due to this upward pressing, the tip end portion 20a of the probe 20 is displaced upward.

Also, due to the upward pressing of the tip end portion 20a of the probe 20 by means of the electrode pad 14a, the bent portion 20z of the probe 20 is elastically deformed significantly or is bent significantly in one direction in the perpendicular direction X labeled with a reference sign 40b. When the bent portion 20z of the probe 20 is bent significantly, the probe 20 is pressed to an edge portion 33b of the middle guide hole 33a of the middle guide portion 33 while sliding on the edge portion 33b.

In the electric connecting apparatus 10 according to Embodiment 1 of the present invention, the middle guide portion 33 is provided to be movable in the perpendicular direction X. For this reason, even in a case in which the bent portion 20z is bent to cause the bent portion 20z to be pressed to the edge portion 33b of the middle guide hole 33a, the middle guide portion 33 can "move in the perpendicular direction X" as labeled with a reference sign 40c in FIG. 3 and can "move in the thickness direction Y" as labeled with a reference sign 40d along with bending of the bent portion 20z. Accordingly, the probe 20 can be prevented from being strongly pressed to the edge portion 33b of the middle guide hole 33a further than in a case in which the middle guide portion 33 is secured.

This can prevent the probe 20 from stopping at the edge portion 33b when pressing of the tip end portion 20a of the probe 20 is released. That is, since the probe 20 can elastically return smoothly when pressing of the tip end portion 20a of the probe 20 is released, the shape of the probe 20 can reliably return, and an unreturned state can be prevented.

In addition, since the probe 20 can be prevented from being strongly pressed to the edge portion 33b of the middle guide hole 33a, the probe 20 can be prevented from being in friction with the edge portion 33b of the middle guide hole 33a and being damaged.

It is to be noted that "moving in the perpendicular direction X and in the thickness direction Y" includes a case of moving in parallel with the perpendicular direction X, a case of moving in parallel with the thickness direction Y, and a case of moving in a direction obtained by combination of the perpendicular direction X and the thickness direction Y (for example, a diagonal direction with respect to the perpendicular direction X).

Also, in FIG. 3, the distance L1 set as the movable range of the middle guide portion 33 in the perpendicular direction X is preferably larger than a deforming amount L3 of the bent portion 20z in the perpendicular direction X deformed along with pressing of the probe 20. Consequently, even when the middle guide portion 33 is pressed by the bent portion 20z, the middle guide portion 33 can be prevented from abutting on the spacer member 34. Accordingly, the probe 20 can more reliably be prevented from being strongly pressed to the edge portion 33b of the middle guide hole 33a.

Figure 4:
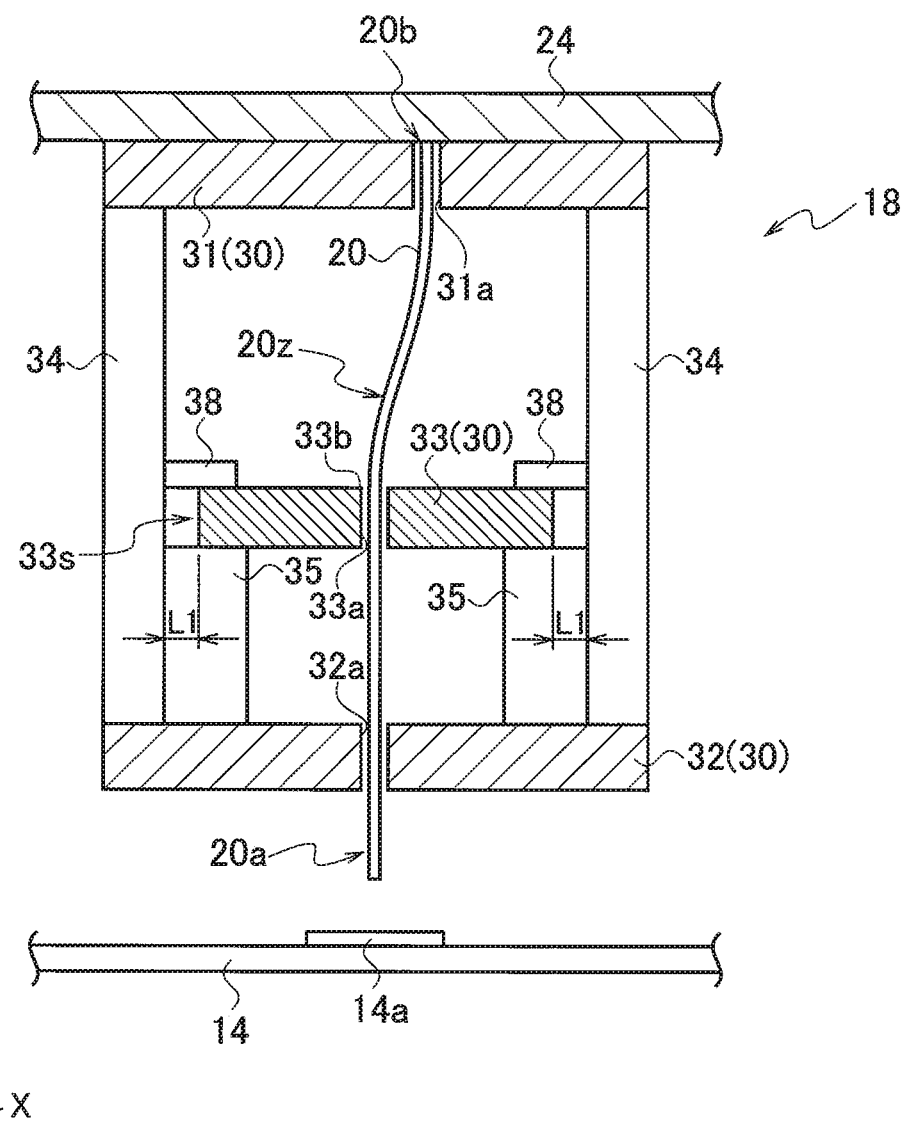
FIG. 4 is a partially enlarged cross-sectional view schematically illustrating a part of another example of the electric connecting apparatus according to Embodiment 1 of the present invention.

Also, in the electric connecting apparatus 10 according to Embodiment 1 of the present invention, the distance L2 set as the movable range of the middle guide portion 33 in the thickness direction Y may not necessarily be provided. For example, as illustrated in FIG. 4, only the distance L1 may be provided without providing the distance L2. That is, the middle guide portion 33 may be configured to be movable only in the perpendicular direction X, not in the thickness direction Y.

Embodiment 2

Figure 5:
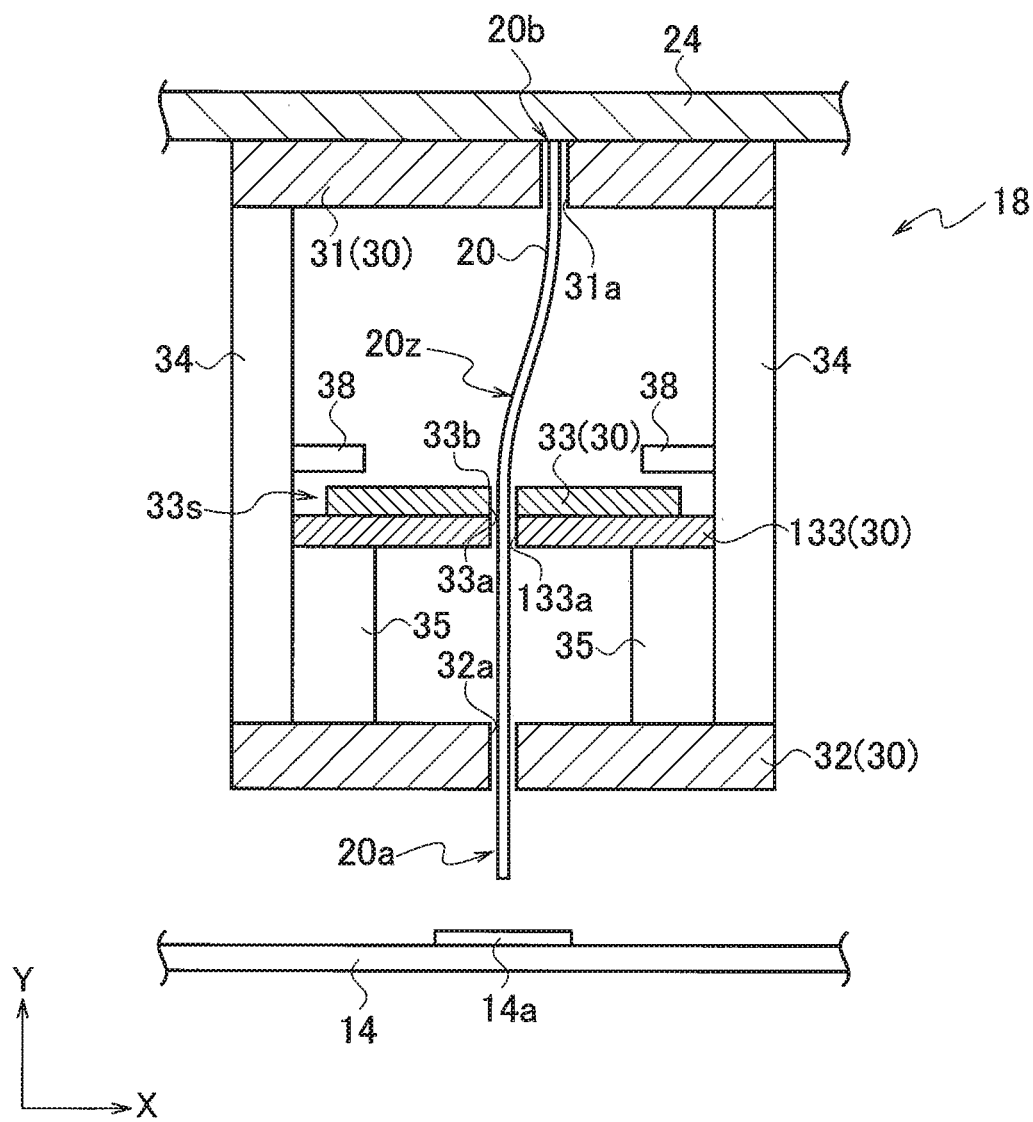
FIG. 5 is a partially enlarged cross-sectional view schematically illustrating a part of the electric connecting apparatus according to Embodiment 2 of the present invention.

Next, a configuration of the electric connecting apparatus 10 according to Embodiment 2 of the present invention will be described. FIG. 5 is a partially enlarged cross-sectional view of the electric connecting apparatus 10 according to Embodiment 2 of the present invention.

In Embodiment 1 of the present invention described above, the electric connecting apparatus 10 in which the guide portion 30 includes three portions consisting of the upper guide portion 31, the middle guide portion 33, and the lower guide portion 32 has been described as an example.

In the electric connecting apparatus 10 according to Embodiment 2 of the present invention, the guide portion 30 additionally includes an auxiliary secured guide portion 133 as illustrated in FIG. 5. The auxiliary secured guide portion 133 is provided to be secured between the middle guide portion 33 and the lower guide portion 32. The auxiliary secured guide portion 133 is provided with an auxiliary secured guide hole 133a, and the probe 20 passes through the auxiliary secured guide hole 133a of the auxiliary secured guide portion 133.

In the perpendicular direction X, the position of the auxiliary secured guide hole 133a of the auxiliary secured guide portion 133 is set to correspond to the position of the lower guide hole 32a of the lower guide portion 32 and is set to be displaced from the position of the upper guide hole 31a of the upper guide portion 31 as much as a predetermined amount.

The bent portion 20z of the probe 20 is formed between the upper guide portion 31 and the middle guide portion 33.

As described above, in the electric connecting apparatus 10 according to Embodiment 2 of the present invention, the guide portion 30 additionally includes the auxiliary secured guide portion 133 provided to be secured between the middle guide portion 33 and the lower guide portion 32. The auxiliary secured guide portion 133 includes the auxiliary secured guide hole 133a letting the probe 20 pass therethrough.

Thus, since the probe 20 passes through the two guide holes, that is, the auxiliary secured guide hole 133a of the auxiliary secured guide portion 133 and the lower guide hole 32a of the lower guide portion 32, on a lower side of the middle guide portion 33, the probe 20 is guided toward the semiconductor wafer 14 while keeping linearity in the thickness direction Y. Accordingly, movement of the probe 20 in the thickness direction Y can be stabilized.

In other words, with the electric connecting apparatus 10 according to Embodiment 2 of the present invention, movement of the probe 20 on the lower side of the middle guide portion 33 can be stabilized while the probe 20 is prevented from being strongly pressed to the edge portion 33b of the middle guide hole 33a.

Embodiment 3

Figure 6:
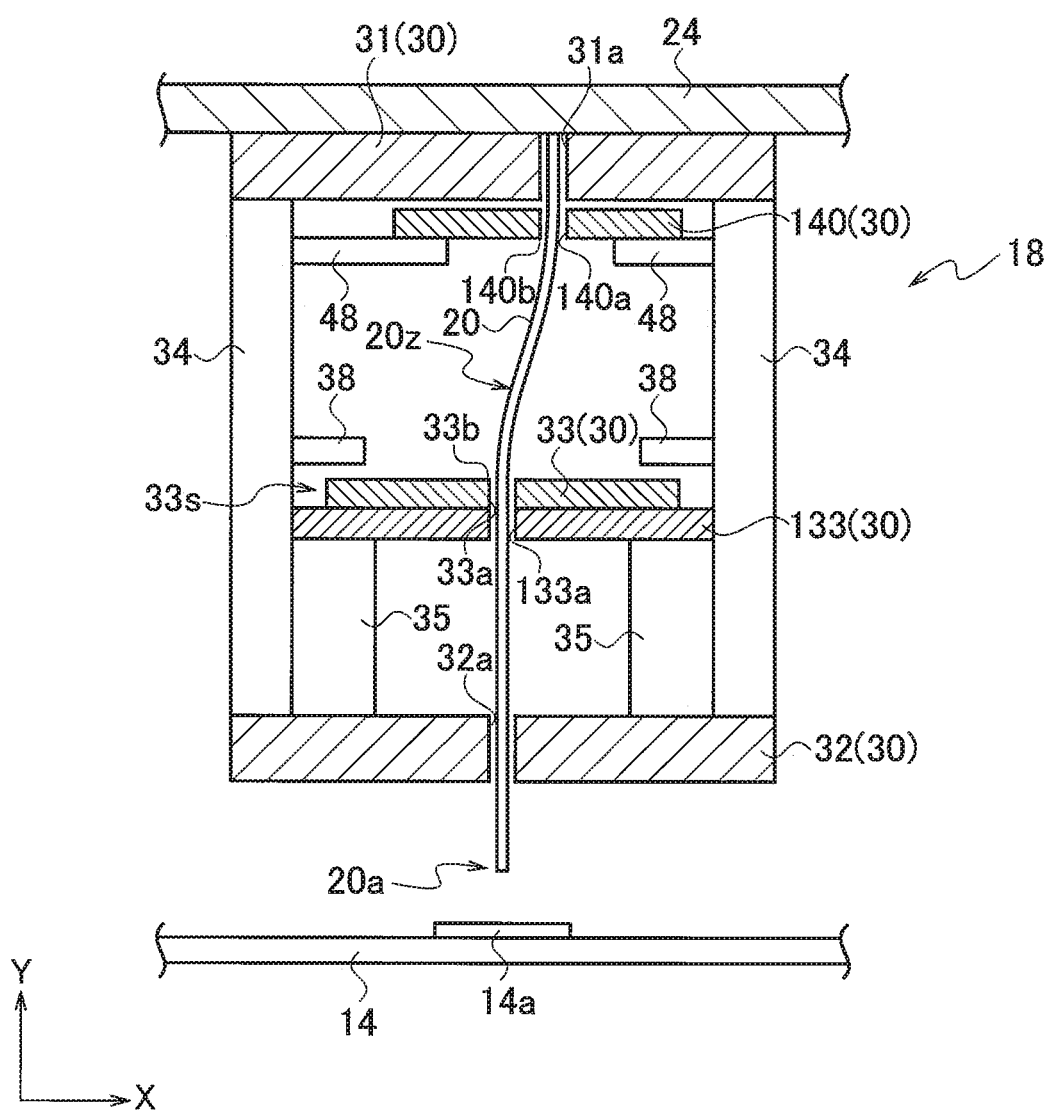
FIG. 6 is a partially enlarged cross-sectional view schematically illustrating a part of the electric connecting apparatus according to Embodiment 3 of the present invention.

Next, the electric connecting apparatus 10 according to Embodiment 3 of the present invention will be described. FIG. 6 is a partially enlarged cross-sectional view of the electric connecting apparatus 10 according to Embodiment 3 of the present invention.

In each of Embodiments 1 to 2 of the present invention, although the electric connecting apparatus 10 in which the guide portion 30 includes one middle guide portion 33 provided to be movable in the perpendicular direction X and the thickness direction Y has been described as an example, the present invention is not limited to this.

As illustrated in FIG. 6, in the electric connecting apparatus 10 according to Embodiment 3 of the present invention, the guide portion 30 additionally includes another middle guide portion 140 (hereinbelow, a second middle guide portion 140) arranged between the middle guide portion 33 (hereinbelow, the first middle guide portion 33) and the upper guide portion 31.

Similarly to the first middle guide portion 33, the second middle guide portion 140 is provided to be movable in the perpendicular direction X. The second middle guide portion 140 is arranged further on the upper side in the thickness direction Y than the bent portion 20z. Specifically, the second middle guide portion 140 is mounted on an upper surface of a lower support member 48 projecting in the perpendicular direction X from the spacer member 34. For this reason, similarly to the first middle guide portion 33, the second middle guide portion 140 is provided to be freely movable in the perpendicular direction X and the thickness direction Y on the upper surface of the lower support member 48 in accordance with movement of the probe 20 passing through a second middle guide hole 140a.

Accordingly, since the second middle guide portion 140 is movable, even when the probe 20 is pressed to an edge portion 140b of the second middle guide hole 140a due to bending of the bent portion 20z of the probe 20, the probe 20 can be prevented from stopping at the edge portion 140b on an upper side of the bent portion 20z of the probe 20 in the thickness direction Y as well.

Also, in the electric connecting apparatus 10 according to Embodiment 3 of the present invention, the first middle guide portion 33 is arranged further on the lower side in the thickness direction Y than the bent portion 20z while the second middle guide portion 140 is arranged further on the upper side in the thickness direction Y than the bent portion 20z. Thus, since the bent portion 20z of the probe 20 is arranged between the first middle guide portion 33 and the second middle guide portion 140, the probe 20 can be prevented from being strongly pressed to the edge portions 33b and 140b on both the upper and lower sides of the bent portion 20z of the probe 20 in the thickness direction Y. Accordingly, since the probe 20 can be prevented from stopping at the edge portions 33b and 140b, the shape of the probe 20 can more reliably return, and an unreturned state can be prevented. Also, the probe 20 can be prevented from being in friction with the edge portions 33b and 140b and being damaged.

Also, due to the guide effects of the upper guide hole 31a, the second middle guide hole 140a, the middle guide hole 33a, and the lower guide hole 32a, linear movement of the tip end portion 20a of the probe 20 in the thickness direction Y is further assured.

It is to be noted that, although the electric connecting apparatus 10 in which the guide portion 30 includes the two movable portions consisting of the first middle guide portion 33 and the second middle guide portion 140 is illustrated in the example in FIG. 6, the guide portion 30 may include three or more movable middle guides. For example, the guide portion 30 may include at an upper end portion of the lower guide portion 32 a third middle guide portion including a guide hole corresponding to the middle guide hole 33a in the thickness direction. Also, although the electric connecting apparatus 10 in which the guide portion 30 includes the auxiliary secured guide portion 133 is illustrated in the example in FIG. 6, the guide portion 30 may not necessarily include the auxiliary secured guide portion 133.

Embodiment 4

Figure 7:
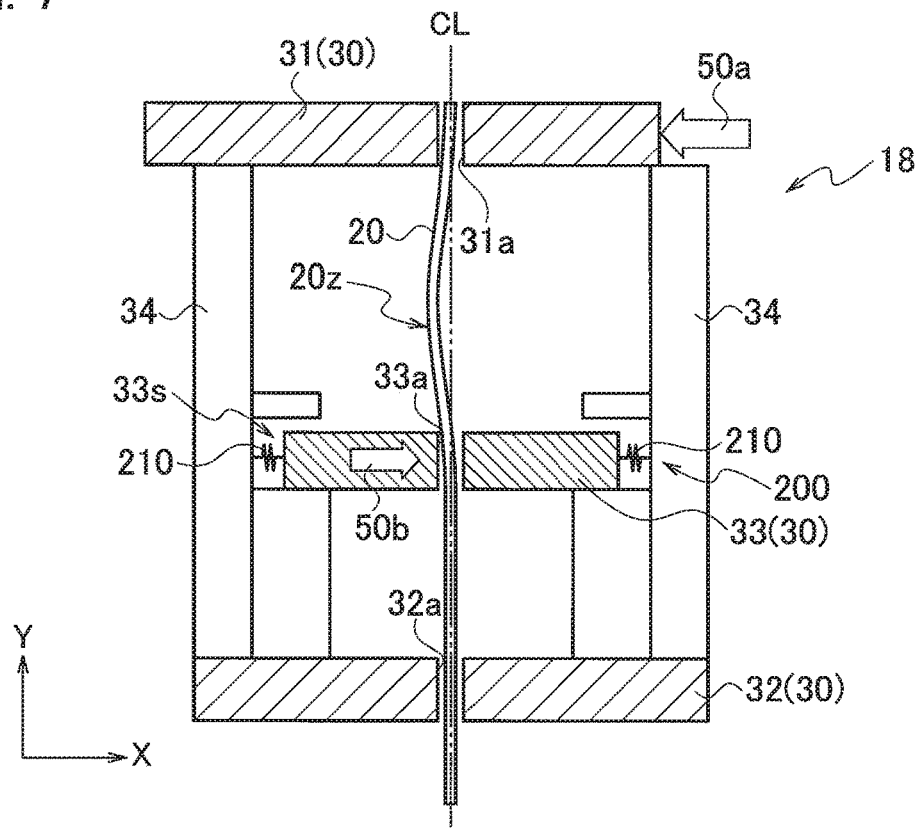
FIG. 7 is a partially enlarged cross-sectional view schematically illustrating a part of the electric connecting apparatus according to Embodiment 4 of the present invention.

Next, the electric connecting apparatus 10 according to Embodiment 4 of the present invention will be described. FIG. 7 is a partially enlarged cross-sectional view of the electric connecting apparatus 10 according to Embodiment 4 of the present invention.

As illustrated in FIG. 7, the upper guide hole 31a of the upper guide portion 31 is displaced from the middle guide hole 33a and the lower guide hole 32a of the middle guide portion 33 and the lower guide portion 32 in the perpendicular direction X as much as a predetermined amount, and at the time of replacement of the probe 20, the upper guide hole 31a of the upper guide portion 31 is moved to cancel the predetermined amount of displacement.

In a state in which the upper guide hole 31a, the middle guide hole 33a, and the lower guide hole 32a of the upper guide portion 31, the middle guide portion 33, and the lower guide portion 32 are aligned, the probe 20 is replaced.

At this time, to facilitate alignment of the upper guide hole 31a, the middle guide hole 33a, and the lower guide hole 32a, the electric connecting apparatus 10 according to Embodiment 4 of the present invention has a function of adjusting the position of the middle guide portion 33.

Specifically, as illustrated in FIG. 7, the electric connecting apparatus 10 according to Embodiment 4 of the present invention includes a positional adjusting portion 200 for adjusting the position of the middle guide hole 33a of the middle guide portion 33 to the position of the lower guide hole 32a of the lower guide portion 32 in the perpendicular direction X perpendicular to the thickness direction Y after the guide hole 31a of the upper guide portion 31 is moved in the arrow direction labeled with a reference sign 50a in FIG. 7.

The positional adjusting portion 200 is arranged between the upper guide portion 31 and the lower guide portion 32. The positional adjusting portion 200 may be provided in the movable chamber 33s. For example, the positional adjusting portion 200 may be an elastic body 210 moving the middle guide portion 33 in the perpendicular direction X. Examples of the elastic body 210 are a coil spring and a plate spring. The elastic body 210 is arranged between the middle guide portion 33 and the spacer member 34. One or a plurality of elastic body (bodies) 210 is (are) arranged at an end portion of the middle guide portion 33 in the perpendicular direction X.

Thus, when pressing of the tip end portion 20a of the probe 20 by means of the semiconductor wafer 14 is released, and the guide hole 31a of the upper guide portion 31 is moved, the middle guide portion 33 moves in the arrow direction labeled with a reference sign 50b in FIG. 7 due to a restoring force of the elastic body 210, and the position of the middle guide hole 33a of the middle guide portion 33 can thus be adjusted to the position of the lower guide hole 32a of the lower guide portion 32. That is, in the perpendicular direction X, the position of the upper guide hole 31a of the upper guide portion 31, the position of the middle guide hole 33a of the middle guide portion 33, and the position of the lower guide hole 32a of the lower guide portion 32 can be adjusted along a straight line CL.

Meanwhile, the elastic body 210 may be provided between the middle guide portion 33 and the upper support member 38 as well so that the middle guide portion 33 may move not only in the perpendicular direction X but also in the thickness direction Y. That is, the elastic body 210 may be provided so that the middle guide portion 33 may move at least either in the thickness direction Y or in the perpendicular direction.

Also, a piezoelectric element, which expands and contracts when voltage is applied, may be applied to the elastic body 210. In this case, the positional adjusting portion 200 may further include a control unit (not illustrated) controlling voltage to be applied to the piezoelectric element, and the position of the middle guide portion 33 may be adjusted at an arbitrary time under control by means of the control unit.

Figure 8:
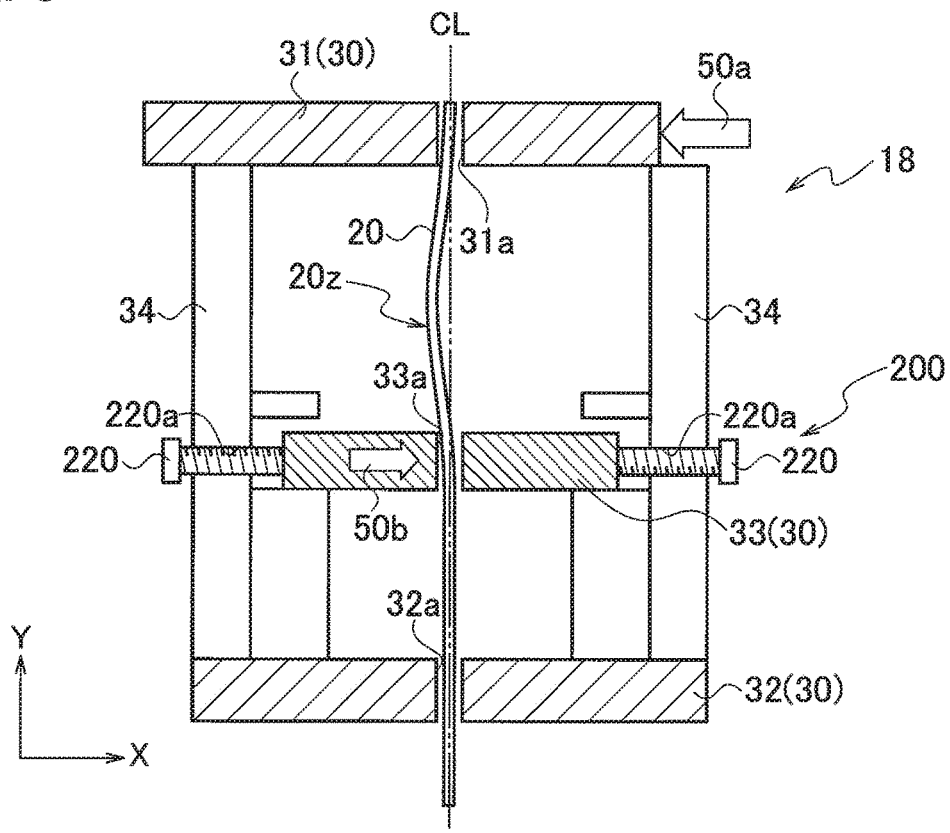
FIG. 8 is a partially enlarged cross-sectional view schematically illustrating a part of the electric connecting apparatus according to Embodiment 4 of the present invention.

Also, as illustrated in FIG. 8, the positional adjusting portion 200 may include a screw portion 220 moving the middle guide portion 33 in the perpendicular direction X. Specifically, the positional adjusting portion 200 may include one or a plurality of set(s) each consisting of a screw hole 220a formed in the spacer member 34 and the screw portion 220 screwed into the screw hole 220a at an end portion of the middle guide portion 33 in the perpendicular direction X. In this case, the screw portion 220 may be attached only at the time of replacement of the probe 20, and the position of the middle guide portion 33 may be adjusted by adjusting the tightening amount of the screw portion 220.

Other Embodiments of Present Invention

Although the present invention has been described in detail with use of the above embodiments, it is to be understood by those skilled in the art that the present invention is not limited to the embodiments described in the present description.

Figure 9:
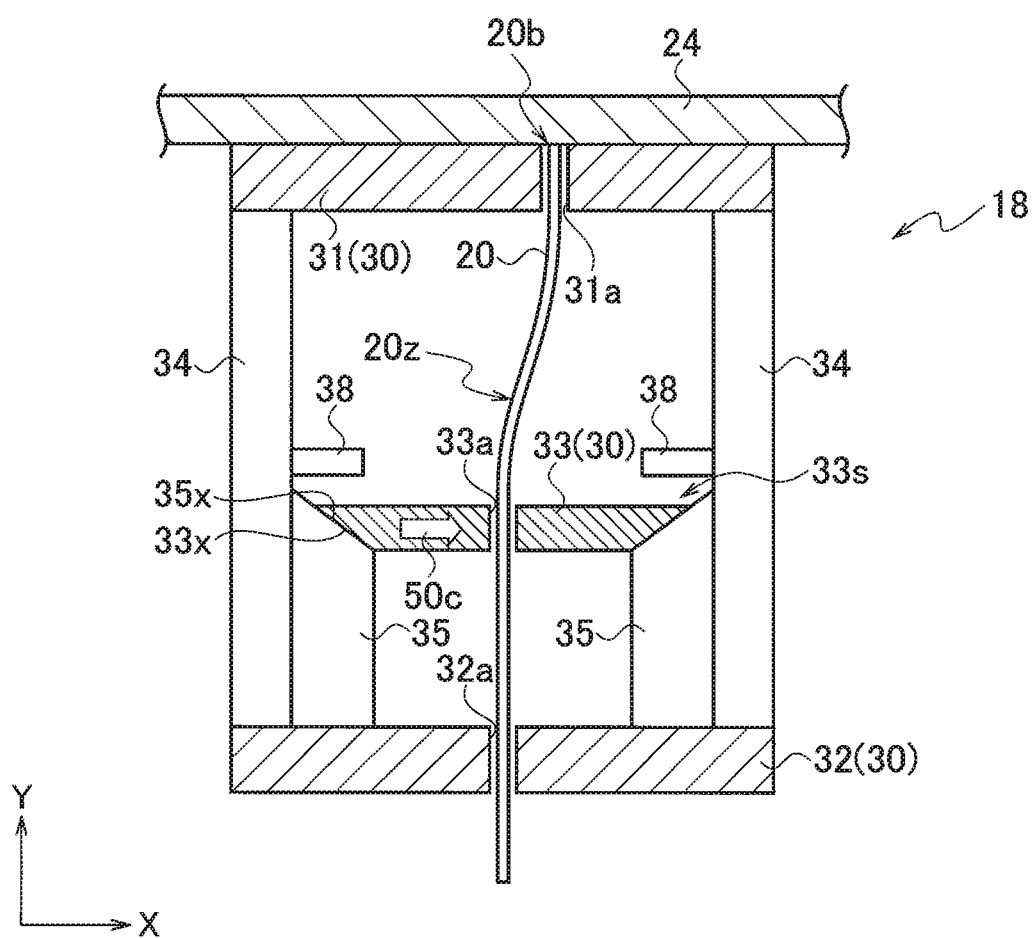
FIG. 9 is a partially enlarged cross-sectional view schematically illustrating a part of the electric connecting apparatus according to another embodiment of the present invention.
Figure 10:
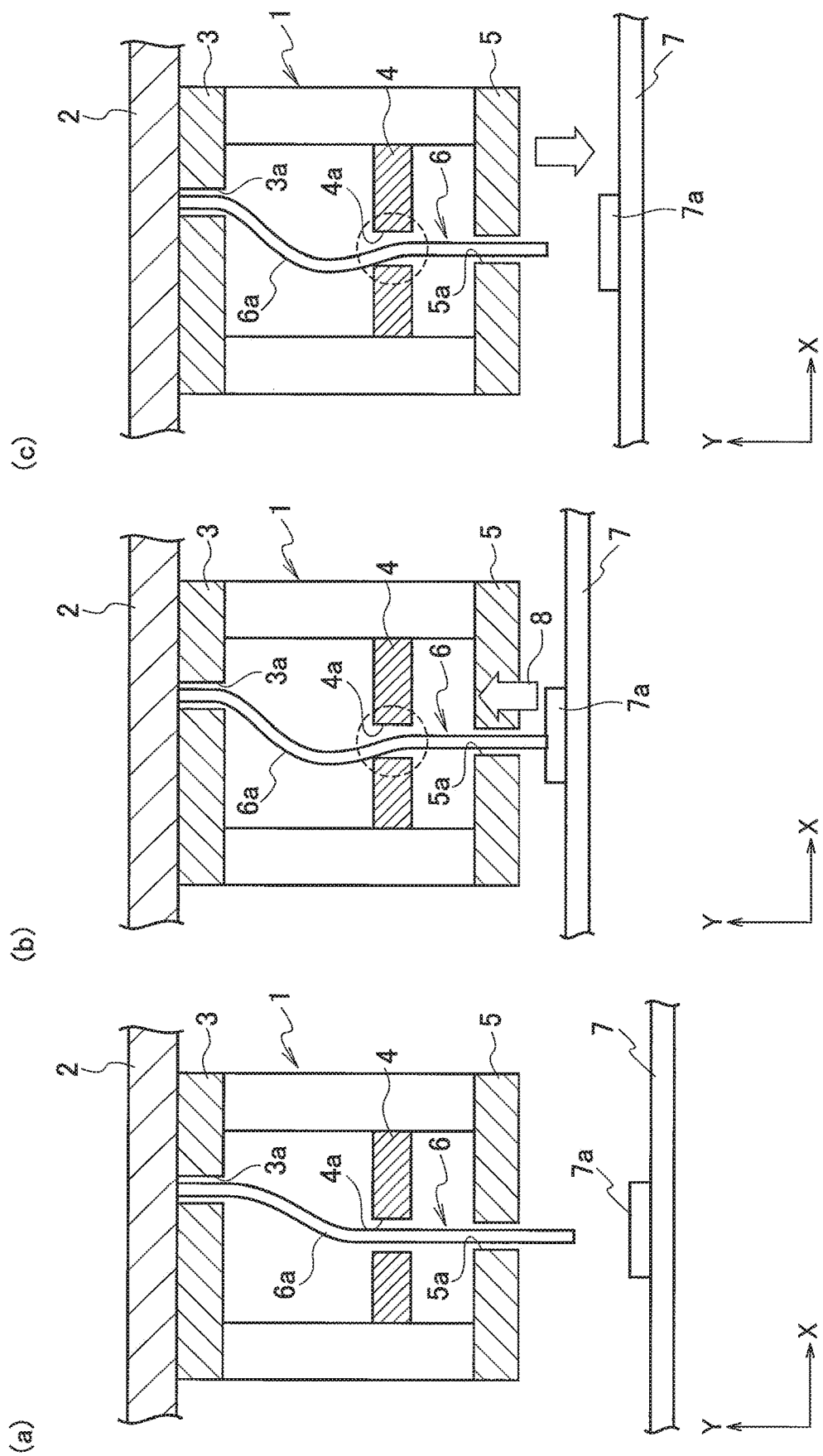
FIG. 10(a) is a partially enlarged cross-sectional view schematically illustrating a part of a conventional electric connecting apparatus.
FIG. 10(b) is a partially enlarged cross-sectional view schematically illustrating a part of the conventional electric connecting apparatus.
FIG. 10(c) is a partially enlarged cross-sectional view schematically illustrating a part of the conventional electric connecting apparatus.

For example, FIG. 9 is a partially enlarged cross-sectional view schematically illustrating a part of the electric connecting apparatus 10 according to another embodiment of the present invention. As illustrated in FIG. 9, the movable chamber 33s may include as a mounting surface mounting the middle guide portion 33 an upper surface 35x of the lower support member 35, and the upper surface 35x may be inclined.

In the example in FIG. 9, the upper surface 35x is inclined toward the lower guide hole 32a. The middle guide portion 33 slides on the upper surface 35x to cause the position of the middle guide hole 33a in the perpendicular direction X to be adjusted to the position of the lower guide hole 32a.

Specifically, the upper surface 35x of the lower support member 35 is inclined in a conical shape centering on the lower guide hole 32a, and a side surface 33x of the middle guide portion 33 is inclined to be opposed to the upper surface 35x of the lower support member 35.

Accordingly, when pressing of the tip end portion 20a of the probe 20 is released, the middle guide portion 33 slides along the upper surface 35x of the lower support member 35, and the middle guide portion 33 can thus be moved to a predetermined position. That is, the middle guide portion 33 can be moved so that the middle guide hole 33a of the middle guide portion 33 and the lower guide hole 32a of the lower guide portion 32 may be aligned with each other.

Also, in each of the above embodiments, although a case in which the probe 20 includes the bent portion 20z has been described as an example, the present invention is not limited to such a configuration. In the electric connecting apparatus according to the present invention, the probe 20 is not always required to include the bent portion 20z. For example, the probe 20 may be formed in a linear shape.

In the electric connecting apparatus according to the present invention, the middle guide portion 33 is provided to be movable. Thus, even in a case in which the probe 20 including no bent portion 20z slides on the edge portion 33b of the middle guide hole 33a, the probe 20 can be prevented from being strongly pressed to the edge portion 33b of the middle guide hole 33a. Accordingly, the probe 20 can be prevented from being in friction with the edge portion 33b of the middle guide hole 33a and being damaged.

In this manner, the present invention is not limited to the above embodiments as they are and can be embodied by changing the components without departing from the scope thereof when the present invention is carried out. Also, by arbitrarily combining the plurality of components disclosed in the above embodiments, various inventions can be formed.

REFERENCE SIGNS LIST 10 electric connecting apparatus
12 chuck
14 semiconductor wafer
16 probe substrate
18 probe support body
20 probe
20a tip end portion
20b base end portion
20z bent portion
22 tester land
24 space transformer
30 guide portion
31 upper guide portion
32 lower guide portion
33 middle guide portion
34 spacer member
35 lower support member
38 upper support member
48 lower support member
133 auxiliary secured guide portion
140 middle guide portion
200 positional adjusting portion
210 elastic body
220 screw portion

What is claimed is:

1. An electric connecting apparatus comprising:
a plurality of probes pressed at tip end portions thereof by a device under test;
a probe substrate connected to base end portions of the plurality of probes; and
a probe support body, when the tip end portions of the plurality of probes are pressed by the device under test, preventing the adjacent probes of the plurality of probes from interfering with each other,
wherein the probe support body includes a plate-like guide portion arranged on a lower side of the probe substrate and including a plurality of guide holes through which the plurality of probes pass,
wherein the guide portion includes an upper guide portion, a lower guide portion, and a middle guide portion arranged between the upper guide portion and the lower guide portion, the upper guide portion and the lower guide portion held by a spacer member,
wherein the upper guide portion includes a plurality of upper guide holes, the middle guide portion includes a plurality of middle guide holes, and the lower guide portion includes a plurality of lower guide holes,
wherein the plurality of probes pass through the upper guide holes, the middle guide holes, and the lower guide holes to be guided toward the device under test,
wherein the middle guide portion is provided to be movable, relative to the upper guide portion, the lower guide portion, and the spacer member, in a perpendicular direction perpendicular to a thickness direction of the middle guide portion, and
wherein the middle guide portion moves in the perpendicular direction, relative to the upper guide portion and the lower guide portion, and in accordance with movement and bending of the probes, when the tip end portions of the probes are pressed by the device under test.

2. The electric connecting apparatus according to claim 1, wherein each of the plurality of probes includes, between the upper guide portion and the lower guide portion, a section that bends into a portion bent when each of the plurality of probes is pressed by the device under test.

3. The electric connecting apparatus according to claim 1, wherein the middle guide portion is provided to be movable in the thickness direction of the middle guide portion.

4. The electric connecting apparatus according to claim 1, wherein the guide portion further includes an auxiliary secured guide portion provided to be secured between the middle guide portion and the lower guide portion,
wherein the auxiliary secured guide portion includes an auxiliary secured guide hole, and
wherein each of the plurality of probes passes through the upper guide hole, the middle guide hole, the auxiliary secured guide hole, and the lower guide hole.

5. The electric connecting apparatus according to claim 1, wherein a movable chamber defining a movable range of the middle guide portion is provided between the upper guide portion and the lower guide portion.

6. The electric connecting apparatus according to claim 5, wherein the movable chamber includes a positional adjusting portion adjusting a position of the middle guide hole to a position of the lower guide hole in the perpendicular direction perpendicular to the thickness direction.

7. The electric connecting apparatus according to claim 1, wherein a positional adjusting portion adjusting a position of the middle guide hole to a position of the lower guide hole in the perpendicular direction perpendicular to the thickness direction is provided between the upper guide portion and the lower guide portion.

8. The electric connecting apparatus according to claim 6, wherein the positional adjusting portion is an elastic body moving the middle guide portion at least either in the thickness direction or in the perpendicular direction of the middle guide portion.

9. The electric connecting apparatus according to claim 5, wherein the movable chamber includes a mounting surface mounting the middle guide portion, and wherein the mounting surface is inclined toward the lower guide hole so that the middle guide portion may slide on the mounting surface to cause a position of the middle guide hole in the perpendicular direction perpendicular to the thickness direction to be adjusted to a position of the lower guide hole.

10. The electric connecting apparatus according to claim 2, wherein the guide portion includes, between the middle guide portion and the upper guide portion, a second middle guide portion provided to be movable in the perpendicular direction perpendicular to the thickness direction, and wherein the second middle guide portion is arranged above the bent portion in the thickness direction.

11. An electric connecting apparatus comprising:

a plurality of probes pressed at tip end portions thereof by a device under test;

a probe substrate connected to base end portions of the plurality of probes; and a probe support body, when the tip end portions of the plurality of probes are pressed by the device under test, preventing the adjacent probes of the plurality of probes from interfering with each other, wherein the probe support body includes a plate-like guide portion arranged on a lower side of the probe substrate and including a plurality of guide holes through which the plurality of probes pass, wherein the guide portion includes an upper guide portion, a lower guide portion, and a middle guide portion arranged between the upper guide portion and the lower guide portion, wherein the upper guide portion includes a plurality of upper guide holes, the middle guide portion includes a plurality of middle guide holes, and the lower guide portion includes a plurality of lower guide holes, wherein the plurality of probes pass through the upper guide holes, the middle guide holes, and the lower guide holes to be guided toward the device under test, wherein the middle guide portion is provided to be movable in a perpendicular direction perpendicular to a thickness direction of the middle guide portion, and wherein a movable chamber defining a movable range of the middle guide portion is provided between the upper guide portion and the lower guide portion.

12. The electric connecting apparatus according to claim 11, wherein each of the plurality of probes includes, between the upper guide portion and the lower guide portion, a section that bends into a bent portion when each of the plurality of probes is pressed by the device under test.

13. The electric connecting apparatus according to claim 12, wherein the guide portion includes, between the middle guide portion and the upper guide portion, a second middle guide portion provided to be movable in the perpendicular direction perpendicular to the thickness direction, and wherein the second middle guide portion is arranged above the bent portion in the thickness direction.

14. The electric connecting apparatus according to claim 11, wherein the middle guide portion is provided to be movable in the thickness direction of the middle guide portion.

15. The electric connecting apparatus according to claim 11, wherein the guide portion further includes an auxiliary secured guide portion provided to be secured between the middle guide portion and the lower guide portion, wherein the auxiliary secured guide portion includes an auxiliary secured guide hole, and wherein each of the plurality of probes passes through the upper guide hole, the middle guide hole, the auxiliary secured guide hole, and the lower guide hole.

16. The electric connecting apparatus according to claim 11, wherein the movable chamber includes a positional adjusting portion adjusting a position of the middle guide hole to a position of the lower guide hole in the perpendicular direction perpendicular to the thickness direction.

17. The electric connecting apparatus according to claim 16, wherein the positional adjusting portion is an elastic body moving the middle guide portion at least either in the thickness direction or in the perpendicular direction of the middle guide portion.

18. The electric connecting apparatus according to claim 11, wherein a positional adjusting portion adjusting a position of the middle guide hole to a position of the lower guide hole in the perpendicular direction perpendicular to the thickness direction is provided between the upper guide portion and the lower guide portion.

19. The electric connecting apparatus according to claim 11, wherein the movable chamber includes a mounting surface mounting the middle guide portion, and wherein the mounting surface is inclined toward the lower guide hole so that the middle guide portion may slide on the mounting surface to cause a position of the middle guide hole in the perpendicular direction perpendicular to the thickness direction to be adjusted to a position of the lower guide hole.

* * * * *